(12) United States Patent
Chung et al.

(10) Patent No.: US 12,088,304 B2
(45) Date of Patent: Sep. 10, 2024

(54) SPREAD SPECTRUM CLOCK GENERATION DEVICE

(71) Applicant: Magnachip Mixed-Signal, Ltd., Cheongju-si (KR)

(72) Inventors: Chelho Chung, Sejong-si (KR); Gilsung Roh, Cheongju-si (KR)

(73) Assignee: Magnachip Mixed-Signal, Ltd., Cheongju-si (KR)

( * ) Notice: Subject to any disclaimer, the term of this patent is extended or adjusted under 35 U.S.C. 154(b) by 0 days.

(21) Appl. No.: 17/968,339

(22) Filed: Oct. 18, 2022

(65) Prior Publication Data
US 2023/0283269 A1 Sep. 7, 2023

(30) Foreign Application Priority Data
Mar. 7, 2022 (KR) .................. 10-2022-0028900

(51) Int. Cl.
*H03K 5/00* (2006.01)
*H03K 5/1252* (2006.01)
*H03K 5/133* (2014.01)
*H03K 5/1536* (2006.01)
*H03K 5/156* (2006.01)

(52) U.S. Cl.
CPC ........... *H03K 5/133* (2013.01); *H03K 5/1252* (2013.01); *H03K 5/1536* (2013.01); *H03K 5/156* (2013.01)

(58) Field of Classification Search
CPC .... H03K 5/133; H03K 5/1252; H03K 5/1536; H03K 5/156
See application file for complete search history.

(56) References Cited

U.S. PATENT DOCUMENTS

| | | | | |
|---|---|---|---|---|
| 5,070,311 A * | 12/1991 | Nicolai | ................ | H03K 3/0231 331/111 |
| 5,477,174 A * | 12/1995 | Capener | ................... | H03K 4/56 327/131 |
| 5,699,024 A * | 12/1997 | Manlove | ................. | H03L 1/022 331/113 R |
| 5,859,571 A * | 1/1999 | Lee | ........................ | G11C 16/16 331/111 |
| 5,912,593 A * | 6/1999 | Susak | .................. | H03K 3/0231 327/134 |
| 6,107,851 A * | 8/2000 | Balakirshnan | ........... | H03K 7/08 327/531 |
| 6,326,859 B1 * | 12/2001 | Goldman | ............... | H03K 3/011 331/111 |

(Continued)

FOREIGN PATENT DOCUMENTS

KR 10-0792042 B1 12/2007

*Primary Examiner* — Tuan T Lam
(74) *Attorney, Agent, or Firm* — NSIP Law

(57) ABSTRACT

A spread spectrum clock generation device that may reduce electromagnetic interference (EMI) includes: a first comparator configured to compare an input signal with a first reference voltage and output a first comparison signal; a second comparator configured to compare the input signal with a second reference voltage and output a second comparison signal; a latch configured to receive the first and second comparison signals as inputs and output an output signal; and a delaying circuit configured to generate the input signal by delaying the output signal to have a different delay time for each time interval.

15 Claims, 3 Drawing Sheets

(56) References Cited

U.S. PATENT DOCUMENTS

| | | | | |
|---|---|---|---|---|
| 7,289,582 B2* | 10/2007 | Jang | ........................ | H04B 15/02 |
| | | | | 455/296 |
| 2007/0146087 A1* | 6/2007 | Hwang | .................. | H03K 4/502 |
| | | | | 331/111 |
| 2010/0007387 A1* | 1/2010 | Chang | ...................... | H03K 4/06 |
| | | | | 327/131 |
| 2012/0319788 A1* | 12/2012 | Wadhwa | .............. | H03K 3/0231 |
| | | | | 331/143 |
| 2013/0285757 A1* | 10/2013 | Cheng | ................... | H04B 15/04 |
| | | | | 331/177 R |
| 2015/0091628 A1* | 4/2015 | Jang | ..................... | G01R 19/175 |
| | | | | 327/264 |
| 2015/0200659 A1* | 7/2015 | Tsao | ........................ | H03K 4/502 |
| | | | | 327/137 |
| 2017/0033707 A1* | 2/2017 | Nishijima | ............... | H02M 1/36 |

* cited by examiner

SPREAD SPECTRUM CLOCK GENERATION DEVICE

CROSS-REFERENCE TO RELATED APPLICATIONS

The present application claims the benefit under 35 U.S.C. 119(a) of Korean Patent Application No. 10-2022-0028900, filed Mar. 7, 2022, the entire disclosure of which is incorporated herein by reference for all purposes.

BACKGROUND

1. Field

The following description relates to a spread spectrum clock generation device that may reduce electromagnetic interference.

2. Description of the Related Art

A frequency generator refers to a circuit that generates a waveform having a specified periodicity according to system requirements. An inverse number of the corresponding waveform cycle is defined as a frequency, and the amount of change in the cycle which occurs during a specific period of time is defined as jitter.

The frequency generator is typically used for a reference clock of a digital system. The frequency generator provides a reference signal necessary for the operation of the digital system. Many digital systems adopt a synchronous design, and all the flip-flops in the system perform updates in synchronization with a clock edge. As the size of the digital system increases, the amount of current flowing at a time point of the corresponding update tends to increase. A large current flow in a closed circuit generates an electromagnetic wave. In the case of a wireless electronic device including a portable terminal, when the electromagnetic wave generated by a large current flow in a closed circuit is close to a frequency used for communication, they interference with each other, resulting in the degradation of the overall system performance. As one of the efforts to reduce the electromagnetic wave causing the interference, a method of reducing the peak power of the electromagnetic wave by adding artificial jitter to the reference clock has been devised.

If the timing of instantaneous current demand of the system is dispersed by artificially generating jitter, the frequency characteristics of the electromagnetic wave generated according to the change of the current will also change. When the current is concentrated at the same point in time (single frequency), the power of the electromagnetic wave is also generated and concentrated at a single frequency.

Therefore, when the time point at which the current is generated (in proportion to the magnitude of the jitter) changes, the power of the electromagnetic wave is also dispersed to the adjacent frequency region. As described above, a technique for expanding the generation frequency of the frequency generator is called a spread spectrum clock generator (SSCG).

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a spread spectrum clock generation device including: a first comparator configured to compare an input signal with a first reference voltage and output a first comparison signal; a second comparator configured to compare the input signal with a second reference voltage and output a second comparison signal; a latch configured to receive the first comparison signal and the second comparison signal as inputs and output an output signal; and a delaying circuit configured to generate the input signal by delaying the output signal to have a different delay time for each time interval.

The delaying circuit may include: a plurality of delay circuits configured to receive the output signal and generate a plurality of delay output signals having different delay times; a multiplexer configured to receive the plurality of delay output signals and select one of the plurality of delay output signals in accordance with a selection signal; and a channel selector configured to receive the output signal and generate the selection signal.

The channel selector may include a first counter and a second counter which use the output signal as a clock. A length of the time interval may be determined based on a maximum value of the first counter. The selection signal may be generated based on an output value of the second counter.

When the length of the time interval is determined as K number of cycles of the output signal, a number of bits of the first counter is determined as a natural number greater than or equal to $\log_2 K$, and the maximum value of the first counter is set to K−1.

When a number of the plurality of delay circuits is M, a number of bits of the second counter is determined as a natural number greater than or equal to $\log_2 M$, and a maximum value of the second counter may be set to M−1.

Each of the plurality of delay circuits may be implemented as an RC delay circuit or an inverter chain circuit.

When the input signal is greater than the first reference voltage, the first comparator may output 1 (logic high) as the first comparison signal, and when the input signal is less than the first reference voltage, the first comparator may output 0 (logic low) as the first comparison signal. When the input signal is greater than the second reference voltage, the second comparator may output 0 as the second comparison signal, and when the input signal is less than the second reference voltage, the second comparator may output 1 as the second comparison signal.

The first reference voltage may be higher than the second reference voltage.

The latch may be an SR latch which comprises an R input, an S input, and an output terminal. When the R input is 1 and the S input is 0, the output terminal may output 0, and when the R input is 0 and the S input is 1, the output terminal may output 1. The first comparison signal may be input as the R input of the latch, and the second comparison signal may be input as the S input of the latch.

In another general aspect, a spread spectrum clock generation device including: a first comparator configured to compare an input signal with a first reference voltage and output a first comparison signal; a second comparator configured to compare the input signal with a second reference voltage and output a second comparison signal; a latch configured to receive the first comparison signal and the second comparison signal as inputs and output an output signal; and a delaying circuit comprising a plurality of delay circuits configured to receive the output signal and generate a plurality of delay output signals having different delay times. The delaying circuit is configured to generate the input signal in a form of a triangular wave by delaying the output signal to have a different delay time for each time interval.

Advantageous Effects

The spread spectrum clock generation device according to one or more embodiments of the present disclosure outputs a clock signal with a wider frequency spectrum than that of a reference clock signal, thereby reducing electromagnetic interference (EMI). Other features and aspects will be apparent from the following detailed description, the drawings and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
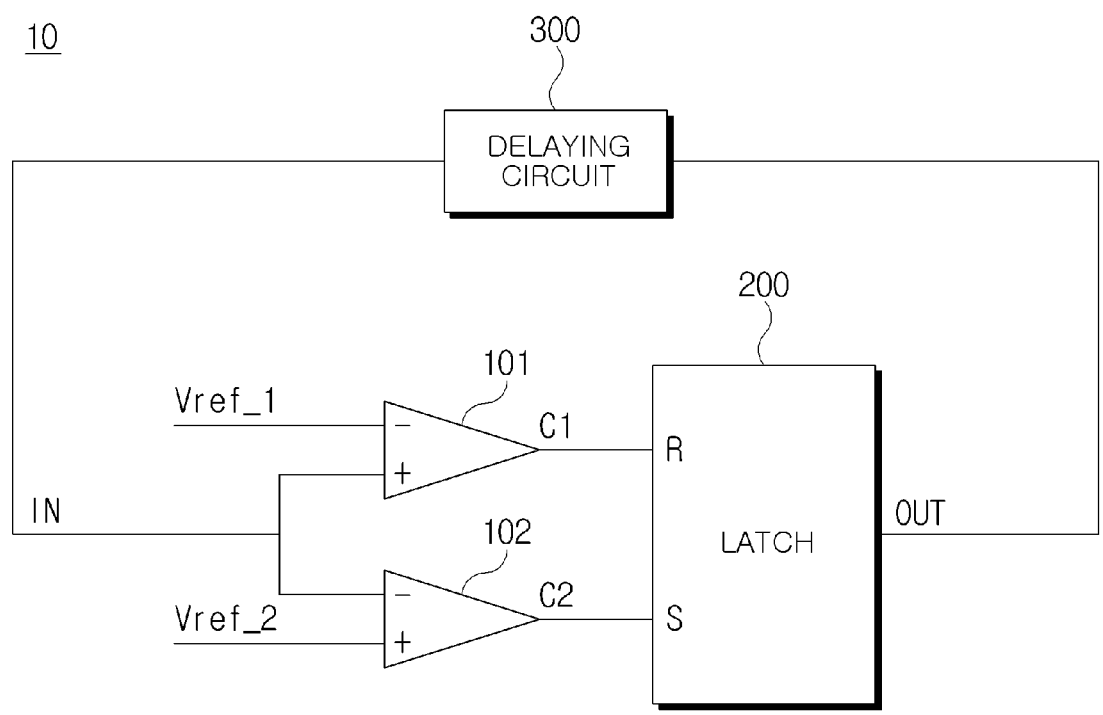
FIG. 1 illustrates a block diagram of an example of a spread spectrum clock generation device according to one or more embodiments of the present disclosure.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
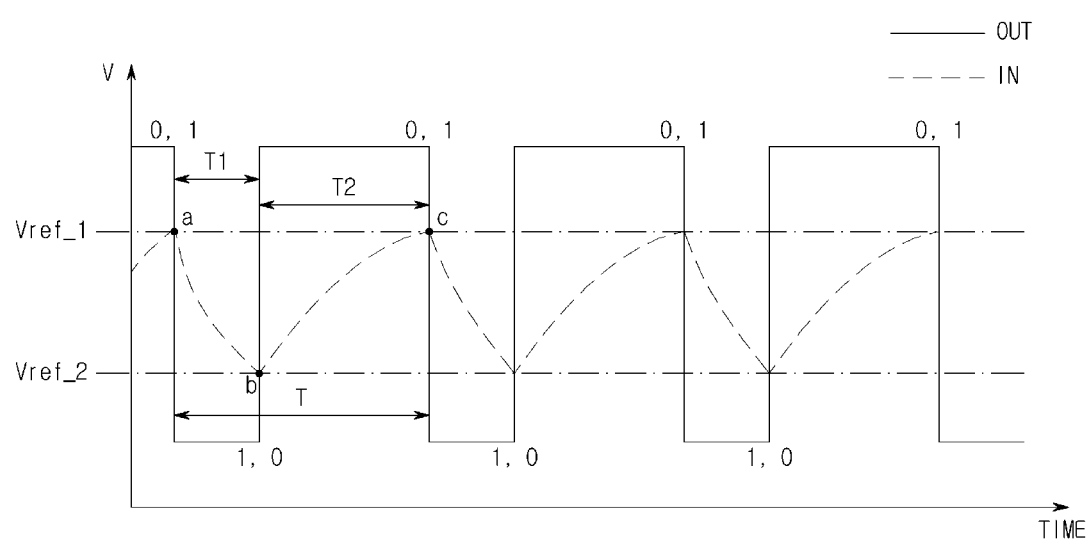
FIG. 2 illustrates a waveform diagram of an example of the spread spectrum clock generation device shown in FIG. 1 according to one or more embodiments of the present disclosure.

FIG. 1 illustrates a block diagram of a spread spectrum clock generation device 10 according to one or more embodiments of the present disclosure. FIG. 2 illustrates a waveform diagram of the spread spectrum clock generation device shown in FIG. 1. A number indicated at a clock edge of FIG. 2 represents values of a set (S) input and a reset (R) input which are input to a latch. For example, [0,1] represents that the set (S) input is 0 (logic low) and the reset (R) input is 1 (logic high). Also, [1,0] represents that the set (S) input is 1 (logic high) and the reset (R) input is 0 (logic low).

The spread spectrum clock generation device 10 according to one ore more embodiments may include a first comparator 101, a second comparator 102, a latch 200, and a delaying circuit 300. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

The first comparator 101 may compare an input signal IN with a first reference voltage Vref_1 and then output a first comparison signal C1. The first comparison signal C1 may be transmitted to the latch 200, and the latch 200 may receive the first comparison signal C1 as a reset (R) input. The first comparator 101 may receive the first reference voltage Vref_1 through a negative (−) input terminal.

The second comparator 102 may compare the input signal IN with a second reference voltage Vref_2 and then output a second comparison signal C2. The second comparison signal C2 may be transmitted to the latch 200, and the latch 200 may receive the second comparison signal C2 as a set (S) input. The second comparator 102 may receive the second reference voltage Vref_2 through a positive (+) input terminal.

The latch 200 may receive the first comparison signal C1 and the second comparison signal C2 as inputs and output an output signal OUT. The latch 200 may be composed of an SR latch. The latch 200 may receive the first comparison signal C1 as the reset (R) input and the second comparison signal C2 as the set (S) input. The latch 200 may output 1 (logic high) when the set (S) input is 1 (logic high) and the reset (R) input is 0 (logic low). Also, the latch 200 may output 0 when the set (S) input is 0 and the reset (R) input is 1. Through this operation, the latch 200 may latch the first comparison signal C1 and the second comparison signal C2 and output a frequency-controlled square wave.

In FIG. 2, the cycle T of the square wave OUT output from the latch 200 may be determined by adding an interval T1 between a point "a" at which the input signal IN meets the first reference voltage Vref_1 and a point "b" at which the input signal IN meets the second reference voltage Vref_2 to an interval T2 between the point "b" at which the input signal IN meets the second reference voltage Vref_2 and a point "c" at which the input signal IN meets again the first reference voltage Vref_1. Accordingly, a factor determining the cycle T of the square wave output from the latch 200 may be determined according to a delay time of the delaying circuit 300 or the values of the first and second reference voltages Vref_1 and Vref_2. In other words, the frequency 1/T of the square wave output from the latch 200 may be controlled according to the delay time of the delaying circuit 300.

The delaying circuit 300 may cause a frequency variation by adding a variable time delay component to a feedback path of the clock generation device. Specifically, the delaying circuit 300 may generate a delayed output signal by delaying the output signal OUT generated by the latch 200, and provide the delayed output signal to the first comparator 101 and the second comparator 102 as the input signal IN. Accordingly, the input signal IN may periodically move between the first reference voltage Vref_1 and the second reference voltage Vref_2 in a triangular wave shape as shown in FIG. 2.

As a result, the output signal OUT generated by the latch 200 passes through the delaying circuit 300 and then is applied to the inputs of the two comparators and makes a round trip between the first reference voltage Vref_1 and the second reference voltage Vref_2. Each time, the first and second comparators 101 and 102 may apply the set (S) signal and the reset (R) signal to the latch 200 and change the output signal OUT of the latch 200. The frequency of the output signal OUT may be determined by operation delay times of the latch 200, the first comparator 101, the second comparator 102, and the delaying circuit 300, respectively. Since the operation delay times of the latch 200, the first comparator 101, and the second comparator 102 are not controllable and may have a fixed value, the frequency (1/T) of the square wave output from the latch 200 may be controlled according to the delay time of the delaying circuit 300. Jitter can be added to the frequency (1/T) of the square wave output from the latch 200 by adjusting the delay time of the delaying circuit 300.

Figure 3:
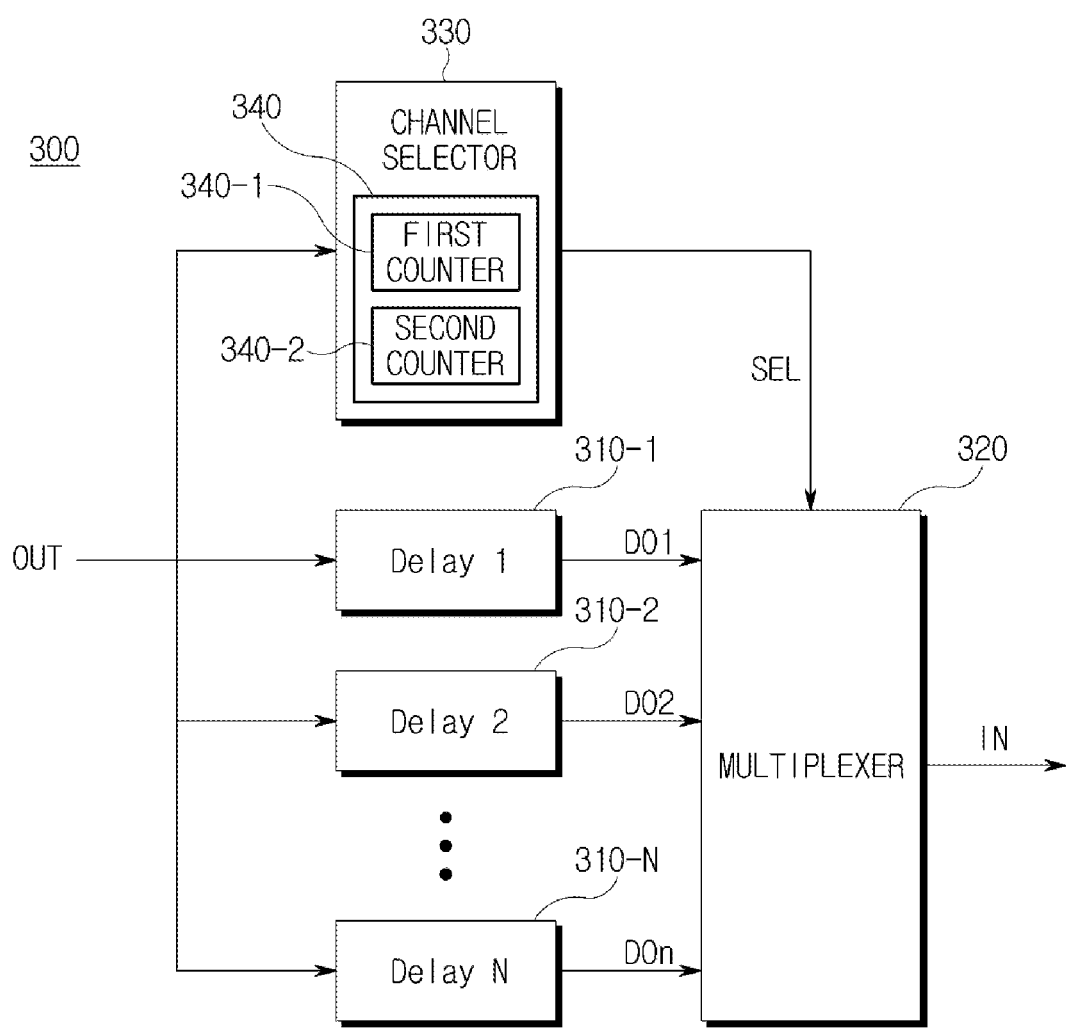
FIG. 3 illustrates a block diagram of a delaying circuit according to one or more embodiments of the present disclosure.

FIG. 3 illustrates a block diagram of the delaying circuit 300 according to one or more embodiments of the present disclosure.

The delaying circuit 300 may include a plurality of delay circuits 310-1 to 310-N connected in parallel, a multiplexer 320, and a channel selector 330. The plurality of delay circuits 310-1 to 310-N connected in parallel may generate delay output signals DO1 to DOn by delaying the output signal OUT, respectively. Compared to delay circuits connected in series, the delay circuits connected in parallel have the advantage of reducing delay circuit stages and avoiding duty cycle variations. Each of the delay circuits 310-1 to 310-N has a specific delay time. That is, the delay times caused by the delay circuits 310-1 to 310-N are different from each other. That is, the delay times corresponding to phase differences between the output signal OUT and the delay output signals DO1 to DOn are different from each other.

The plurality of delay circuits 310-1 to 310-N according to one or more embodiments of the present disclosure may be implemented as an RC delay circuit or an inverter chain circuit, without being limited thereto. The RC delay circuit may determine the delay time of each RC delay circuit by changing a time constant determined by the RC (resistor and capacitor) value.

The multiplexer 320 is connected to the plurality of delay circuits 310-1 to 310-N and may select one of the delay output signals DO1 to DOn according to a selection signal SEL. That is, any one of the delay output signals of the plurality of delay circuits 310-1 to 310-N having different delay times may be selected through the multiplexer 320.

The channel selector 330 may provide the selection signal SEL and may change the selection signal SEL at every cycle of the output signal OUT. According to one or more embodiments, the channel selector 330 may change the selection signal SEL for every predetermined number of cycles. The channel selector 330 may include a counter 340 that counts using the output signal OUT as a clock and provides a count value serving as the selection signal SEL.

The counter 340 may count using the output signal OUT as a clock and change the time delay for each time interval, and as a result, the frequency of the output signal OUT output from the spread spectrum clock generation device may be changed. In other words, the counter 340 may count using the output signal OUT as a clock CLK and set the frequency of the output signal OUT differently for each time interval.

For example, when the counter 340 is 10 bits and there is the number of the plurality of delay circuits 310-1 to 310-N of four, the selection signal SEL may be composed of two higher-order bits of the counter. Then, the selection signal SEL may be output as 00 in a first section in which a value of the counter that counts using the output signal OUT as a clock is 0 to 255. Also, the selection signal SEL may be output as 01 in a second section in which a value of the counter that counts using the output signal OUT as a clock is 256 to 511. Also, the selection signal SEL may be output as 10 in a third section in which a value of the counter 340 that counts using the output signal OUT as a clock is 512 to 767. Also, the selection signal SEL may be output as 11 in a fourth section in which a value of the counter 340 that counts using the output signal OUT as a clock is 768 to 1023.

More generally, the counter 340 may include a first counter 340-1 of lower-order N1 bits and a second counter 340-2 of higher-order N2 bits. Here, the first counter 340-1 and the second counter 340-2 use the output signal OUT as a clock, and the first counter 340-1 increases by 1 for every output signal OUT, while the second counter 340-2 increases by 1 only when the first counter 340-1 has a set maximum value. The output of the second counter 340-2 may be used as the selection signal SEL. In addition, a value of N1 may be determined based on the length of each of the sections, and a value of N2 may be determined based on the number of the plurality of delay circuits.

According to one or more embodiments, if the lengths of the respective sections are set to K number of cycles of the output signal OUT, N1 may be determined as a natural number greater than or equal to $\log_2 K$. For example, if K is 256, N1 may be 8. And if K is 512, N1 may be 9. If K is 254, N1 may be 8, and in this case, the first counter may be reset to 0 after the output value becomes K−1 (253 in this example).

According to one or more embodiments of the present disclosure, if the number of the plurality of delay circuits is M, N2 may be determined as a natural number greater than or equal to $\log_2 M$. For example, if M is 2, N2 may be 1. And if M is 4, N2 may be 2. If M is 6, N2 may be 3, and in this case, the second counter may be reset to 0 after the output value of the second counter becomes M−1 (5 in this example).

The multiplexer 320 may select one of the delay output signals DO1 to DOn in accordance with the selection signal SEL. For example, the multiplexer 320 may select the delay output signal DO1 when the selection signal SEL is 00, the multiplexer 320 may select the delay output signal DO2 when the selection signal SEL is 01, the multiplexer 320 may select the delay output signal DO3 when the selection signal SEL is 10, and the multiplexer 320 may select the delay output signal DO4 when the selection signal SEL is 11.

As a result, the frequency of the output signal OUT in the first section (the 1st clock to the 256th clock) may be set to f1, the frequency of the output signal OUT in the second section (the 257th clock to the 512th clock) may be set to f2, the frequency of the output signal OUT in the third section (513th clock to 768th clock) may be set to f3, and the frequency of the output signal OUT in the fourth section (769th clock to 1024th clock) may be set to f4. Here, the frequencies f1 to f4 of the output signal OUT are determined according to the delay time caused by the respective delay circuits 310. When configured as shown, the frequency of the output signal OUT is changed every 256 clocks and jitter may be artificially generated.

The number of different frequencies of the output signal OUT and the lengths of the respective time interval may be set by controlling the number of bits used by the counter in the channel selector 330 and the number of the plurality of delay circuits 310-1 to 310-N.

According to the spread spectrum clock generation device, in the generation of the output signal OUT that can be used as a clock, the output signals OUT are not generated with the same frequency in all the time interval. The output signals OUT may be generated with different frequencies for each certain time interval, and then jitter can be added to the clock. Accordingly, electromagnetic interference can be reduced by avoiding power from being concentrated at a single frequency and by distributing power to a plurality of frequencies.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A spread spectrum clock generation device comprising:
    a first comparator configured to compare an input signal with a first reference voltage and output a first comparison signal;
    a second comparator configured to compare the input signal with a second reference voltage and output a second comparison signal;
    a latch configured to receive the first comparison signal and the second comparison signal as inputs and output an output signal; and
    a delaying circuit configured to receive the output signal, count using the output signal, and output a count value,
    wherein the delaying circuit is further configured to output the input signal using higher-order bits of the count value and delay the output signal to have a different delay time for each time interval,
    wherein the delaying circuit comprises a channel selector configured to receive the output signal and generate a selection signal,
    wherein the channel selector comprises a first counter and a second counter which use the output signal as a clock, and
    wherein a length of time interval is determined based on a maximum value of the first counter, and the selection signal is generated based on an output value of the second counter.

2. The spread spectrum clock generation device of claim 1, wherein the delaying circuit comprises:
    a plurality of delay circuits configured to receive the output signal and generate a plurality of delay output signals having different delay times; and
    a multiplexer configured to receive the plurality of delay output signals and select one of the plurality of delay output signals in accordance with the selection signal.

3. The spread spectrum clock generation device of claim 1,
    wherein, when the length of the time interval is determined as K number of cycles of the output signal, a number of bits of the first counter is determined as a natural number greater than or equal to $\log_2 K$, and the maximum value of the first counter is set to K−1.

4. The spread spectrum clock generation device of claim 2, wherein, when a number of the plurality of delay circuits is M, a number of bits of the second counter is determined as a natural number greater than or equal to $\log_2 M$, and a maximum value of the second counter is set to M−1.

5. The spread spectrum clock generation device of claim 2,
wherein each of the plurality of delay circuits is implemented as an RC delay circuit or an inverter chain circuit.

6. The spread spectrum clock generation device of claim 1,
wherein, when the input signal is greater than the first reference voltage, the first comparator outputs 1 (logic high) as the first comparison signal, and when the input signal is less than the first reference voltage, the first comparator outputs 0 (logic low) as the first comparison signal, and
wherein, when the input signal is greater than the second reference voltage, the second comparator outputs 0 as the second comparison signal, and when the input signal is less than the second reference voltage, the second comparator outputs 1 as the second comparison signal.

7. The spread spectrum clock generation device of claim 1, wherein the first reference voltage is higher than the second reference voltage.

8. The spread spectrum clock generation device of claim 6,
wherein the latch is an SR latch which comprises an R input, an S input, and an output terminal,
wherein, when the R input is 1 and the S input is 0, the output terminal outputs 0, and when the R input is 0 and the S input is 1, the output terminal outputs 1,
wherein the first comparison signal is input as the R input of the latch, and
wherein the second comparison signal is input as the S input of the latch.

9. A spread spectrum clock generation device comprising:
a first comparator configured to compare an input signal with a first reference voltage and output a first comparison signal;
a second comparator configured to compare the input signal with a second reference voltage and output a second comparison signal;
a latch configured to receive the first comparison signal and the second comparison signal as inputs and output an output signal; and
a delaying circuit comprising a plurality of delay circuits configured to receive the output signal and generate a plurality of delay output signals having different delay times,
wherein the delaying circuit comprises a channel selector configured to receive the output signal and generate a selection signal,
wherein the channel selector comprises a first counter and a second counter which use the output signal as a clock,
wherein a length of time interval is determined based on a maximum value of the first counter, and the selection signal is generated based on an output value of the second counter, and
wherein the delaying circuit is configured to generate the input signal in a form of a triangular wave by delaying the output signal to have a different delay time for each time interval.

10. The spread spectrum clock generation device of claim 9, wherein the delaying circuit further comprises:
a multiplexer configured to receive the plurality of delay output signals and select one of the plurality of delay output signals in accordance with the selection signal.

11. The spread spectrum clock generation device of claim 9,
wherein, when the length of the time interval is determined as K number of cycles of the output signal, a number of bits of the first counter is determined as a natural number greater than or equal to $\log_2 K$, and the maximum value of the first counter is set to K−1.

12. The spread spectrum clock generation device of claim 9,
wherein, when a number of the plurality of delay circuits is M, a number of bits of the second counter is determined as a natural number greater than or equal to $\log_2 M$, and a maximum value of the second counter is set to M−1.

13. The spread spectrum clock generation device of claim 9,
wherein, when the input signal is greater than the first reference voltage, the first comparator outputs 1 (logic high) as the first comparison signal, and when the input signal is less than the first reference voltage, the first comparator outputs 0 (logic low) as the first comparison signal, and
wherein, when the input signal is greater than the second reference voltage, the second comparator outputs 0 as the second comparison signal, and when the input signal is less than the second reference voltage, the second comparator outputs 1 as the second comparison signal.

14. The spread spectrum clock generation device of claim 9, wherein the first reference voltage is higher than the second reference voltage.

15. The spread spectrum clock generation device of claim 13,
wherein the latch is an SR latch which comprises an R input, an S input, and an output terminal,
wherein, when the R input is 1 and the S input is 0, the output terminal outputs 0, and when the R input is 0 and the S input is 1, the output terminal outputs 1,
wherein the first comparison signal is input as the R input of the latch, and
wherein the second comparison signal is input as the S input of the latch.

* * * * *